(12) United States Patent
Danzig et al.

(10) Patent No.: US 7,250,887 B2
(45) Date of Patent: Jul. 31, 2007

(54) SYSTEM AND METHOD FOR SPUR CANCELLATION

(75) Inventors: Joel I. Danzig, Alpharetta, GA (US); Kevin L. Miller, Lawrenceville, GA (US); H. Ray Whitehead, Suwanee, GA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/256,949

(22) Filed: Oct. 25, 2005

(65) Prior Publication Data

US 2006/0087461 A1 Apr. 27, 2006

Related U.S. Application Data

(60) Provisional application No. 60/621,466, filed on Oct. 25, 2004.

(51) Int. Cl.
*H03M 1/66* (2006.01)
(52) U.S. Cl. ............... 341/144; 341/145; 455/209; 455/210; 375/308; 324/6.26
(58) Field of Classification Search ......... 341/140–170
See application file for complete search history.

(56) References Cited

U.S. PATENT DOCUMENTS

| | | | | |
|---|---|---|---|---|
| 5,187,482 A | * | 2/1993 | Tiemann et al. | 341/143 |
| 5,515,046 A | * | 5/1996 | Mandl | 341/143 |
| 5,659,315 A | * | 8/1997 | Mandl | 341/143 |
| 6,384,589 B1 | * | 5/2002 | Gumm et al. | 324/76.26 |
| 6,404,369 B1 | * | 6/2002 | Sheen | 341/143 |
| 6,664,871 B2 | * | 12/2003 | Yip | 333/194 |
| 6,738,004 B2 | * | 5/2004 | Melanson | 341/143 |
| 7,026,846 B1 | | 4/2006 | Huntley, Jr. et al. | 327/105 |
| 7,042,960 B2 | * | 5/2006 | Kintis | 375/308 |

* cited by examiner

*Primary Examiner*—Lam T. Mai
(74) *Attorney, Agent, or Firm*—Sterne, Kessler, Goldstein & Fox PLLC

(57) ABSTRACT

A system for spur cancellation comprises an input, an output, a memory, and a summer. A value corresponding to an energy level of a spur is stored in the memory. The summer is configured to receive an input signal from the input, to receive the value from the memory, to subtract the value from the input signal, and to convey an output signal to the output. The output signal is a difference of the value subtracted from the input signal.

25 Claims, 5 Drawing Sheets

FIG. 6

RECEIVE AN INPUT SIGNAL —602
INTERPOLATE THE INPUT SIGNAL BY A NUMBER —604
UP-CONVERT THE INPUT SIGNAL —606
CONVERT THE INPUT SIGNAL FROM A DIGITAL FORM TO AN ANALOG FORM —608
CONVERT THE VALUE FROM THE DIGITAL FORM TO THE ANALOG FORM —610
SUBTRACT A VALUE FROM THE INPUT SIGNAL —612
PRODUCE AN OUTPUT SIGNAL —614
CONVERT THE OUTPUT SIGNAL FROM THE DIGITAL FORM TO AN ANALOG FORM —616
UP-CONVERT THE OUTPUT SIGNAL —618
DETERMINE THE ENERGY LEVEL OF THE SPUR FROM THE OUTPUT SIGNAL —620
DETERMINE THE VALUE THAT CORRESPONDS TO THE ENERGY LEVEL —622

FIG. 7

RECEIVE AN OUTPUT SIGNAL —702
FILTER THE OUTPUT SIGNAL TO PASS A CHANNEL OF THE OUTPUT SIGNAL —704
DETERMINE THE ENERGY LEVELS OF THE SPUR SIGNAL FROM THE OUTPUT SIGNAL —706
DETERMINE THE SEQUENCE OF THE VALUES THAT CORRESPONDS TO THE ENERGY LEVELS —708
ADJUST THE SEQUENCE OF THE VALUES FOR A PHASE SHIFT —710
SUBTRACT EACH VALUE OF THE SEQUENCE OF THE VALUES —712
FROM AN INPUT SIGNAL IN TURN IN A CONTINUAL CYCLE
PRODUCE AN OUTPUT SIGNAL —714

SYSTEM AND METHOD FOR SPUR CANCELLATION

CROSS-REFERENCE TO RELATED APPLICATIONS

This application claims the benefit of U.S. Provisional Application No. 60/621,466, filed Oct. 25, 2004, which is incorporated herein in its entirety by reference.

BACKGROUND OF THE INVENTION

1. Field of the Invention

The present invention relates to a system and a method for spur cancellation.

2. Related Art

The operations of clocks, input devices, and output devices are among the most significant sources of spurs in a signal processing system, with the spurs occurring at the operating frequencies of these devices and at the harmonic frequencies of the operating frequencies. Prior techniques to address the problem of spurs include spur suppression and spur avoidance.

Spur suppression involves careful analysis of a circuit to determine an optimal arrangement of devices, traces, and ground attachments in the layout of the circuit to prevent spurs from developing. Unfortunately, if a situation arises that requires an alternative layout, another analysis of the circuit must be performed. Furthermore, an optimal arrangement of the layout does not prevent spurs from developing due to changes in temperature, voltage, or other parameters within the circuit.

Spur avoidance is accomplished by designing the circuit so that spurs occur at frequencies outside a desired band of frequencies. Unfortunately, while this technique works well for narrowband signal processing systems, it has limited applications in broadband signal processing systems.

What is needed is a technique for countering the effects of spurs in a broadband signal processing system. Preferably, such a technique would be flexible enough to accommodate both variations in the layout of the circuit and spurs that develop due to changes in temperature, voltage, or other parameters within the circuit.

BRIEF SUMMARY OF THE INVENTION

The present invention relates to a system and a method for spur cancellation. Advantageously, the present invention counters the effects of spurs in broadband signal processing systems and is flexible enough to accommodate both variations in the layout of the circuit and spurs that develop due to changes in temperature, voltage, or other parameters within the circuit.

The system for spur cancellation comprises an input, an output, a memory, and a summer. A value corresponding to an energy level of a spur is stored in the memory. The summer is configured to receive an input signal from the input, to receive the value from the memory, to subtract the value from the input signal, and to convey an output signal to the output. The output signal is a difference of the value subtracted from the input signal.

The system can further comprises an up-converter configured to up-convert the input signal from a first frequency to a second frequency, an up-converter configured to up-convert the output signal from the first frequency to the second frequency, or a first up-converter configured to up-convert the input signal from the first frequency to an intermediate frequency and a second up-converter configured to up-convert the output signal from the intermediate frequency to the second frequency.

The system can further comprise a digital-to-analog converter configured to convert the output signal from a digital form to an analog form. Alternatively, the system can further comprise a first digital-to-analog converter configured to convert the input signal from the digital form to the analog form and a second digital-to-analog converter configured to convert the value from the digital form to the analog form.

The system can further comprise a processor configured to receive the output signal from the output, to determine the energy level of the spur from the output signal, to determine the value corresponding to the energy level, and to convey the value to the memory. If the output signal is in the analog form, then the processor can be further configured to convert the output signal to the analog form. Optionally, a switch can be configured to couple the output to the processor, a switch can be configured to couple the processor to the memory, or a first switch can be configured to couple the output to the processor and a second switch can be configured to couple the processor to the memory.

In an embodiment, the value corresponding to the energy level of the spur can be a sequence of values corresponding to energy levels of a spur signal sampled at a first frequency. The sequence of the values can have a number of the values. The number of the values can be the product of a first number multiplied by a second number. The memory can be configured to store each value of the sequence of the values. The summer can be configured to receive each value of the sequence of the values in turn in a continual cycle at the first frequency and to subtract each value of the sequence of the values from the input signal in turn in the continual cycle at the first frequency. The output signal can be a difference of each value of the sequence of the values subtracted from the input signal in turn in the continual cycle at the first frequency.

In this embodiment, the system can further comprise an interpolator configured to receive the input signal at a second frequency from the input, to interpolate the input signal by the first number, and to convey the input signal at the first frequency to the summer. The second frequency is the product of a fundamental frequency multiplied by the second number. The first frequency is the product of the second frequency multiplied by the first number. The first number is at least two.

In this embodiment, the system can further comprise a counter configured to control receipt by the summer of each value of the sequence of the values from the memory in turn in the continual cycle at the first frequency.

In this embodiment, the system can further comprise a processor configured to receive the output signal from the output, to determine the energy levels of the spur signal from the output signal, to determine the sequence of the values corresponding to the energy levels, and to convey the sequence of the values to the memory. If the output signal is in the analog form, then the processor can be further configured to convert the output signal to the analog form. Optionally, the processor can be further configured to adjust the sequence of the values for a phase shift. Optionally, a switch can be configured to couple the output to the processor, a switch can be configured to couple the processor to the memory, or a first switch can be configured to couple the output to the processor and a second switch can be configured to couple the processor to the memory.

In this embodiment, the system can further comprise a filter configured to receive the output signal from the output, to pass a channel of the output signal, and to convey the channel to the processor. The channel is at one of the fundamental frequency and a harmonic frequency of the fundamental frequency. In this case, the processor can be configured to receive the channel from the filter and to determine the energy levels of the spur signal from the channel. Optionally, the channel can be a set of channels such that each channel in the set of the channels is at a different frequency selected from the fundamental frequency and at least one harmonic frequency of the fundamental frequency. The number of the channels in the set of the channels can be the first number.

The filter can be tunable to each channel in the set of channels. In this case, the processor can be configured to receive in turn each channel in the set of the channels from the filter, to determine in turn the energy levels of the spur signal of each channel in the set of the channels, and to determine the sequence of the values corresponding to the energy levels of the spur signal of the set of the channels from a summation of the energy levels of the spur signal of each channel in the set of the channels.

Alternatively, the filter can comprise a set of bandpass filters. In this case, the processor can be configured to receive in parallel each channel in the set of the channels from a corresponding bandpass filter in the set of bandpass filters, to determine in parallel the energy levels of the spur signal of each channel in the set of the channels, and to determine the sequence of the values corresponding to the energy levels of the spur signal of the set of the channels from a summation of the energy levels of the spur signal of each channel in the set of the channels.

The present invention also relates to a method for spur cancellation. In the method, an input signal is received. Optionally, the input signal is interpolated by a number. Optionally, the input signal is up-converted. Optionally, the input signal is converted from a digital form to an analog form. Optionally, a value that corresponds to an energy level of a spur is converted from the digital form to the analog form. The value is subtracted from the input signal. An output signal is produced. The output signal is the difference of the value subtracted from the input signal. Optionally, the output signal is converted from the digital form to the analog form. Optionally, the output step is up-converted. Optionally, the energy level of the spur is determined from the output signal. Optionally, the value that corresponds to the energy level is determined.

The present invention also relates to a method for determining a sequence of values that corresponds to energy levels of a spur signal. In the method, an output signal is received. Optionally, the output signal is filtered to pass a channel of the output signal. The channel is at one of a fundamental frequency and a harmonic frequency of the fundamental frequency. Alternatively, the output channel can be filtered to pass a set of channels such that each channel in the set of the channels is at a different frequency selected from the fundamental frequency and at least one harmonic frequency of the fundamental frequency.

The energy levels of the spur signal are determined from the output signal. If the output signal was filtered to pass the channel of the output signal, then the energy levels of the spur signal can be determined from the channel of the output signal. If the output signal was filtered to pass the set of the channels, then the energy levels of the spur signal of each channel in the set of the channels can be determined from the set of the channels of the output signal.

The sequence of the values that corresponds to the energy levels is determined. If the output signal was filtered to pass the set of the channels, then the sequence of the values that corresponds to the energy levels of the spur signal of the set of the channels can be determined from a summation of the energy levels of the spur signal of each channel in the set of the channels.

Optionally, the sequence of the values is adjusted for a phase shift. Optionally, each value of the sequence of the values is subtracted from an input signal in turn in a continual cycle. Optionally, the output signal is produced. The output signal is the difference of each value of the sequence of the values subtracted from the input signal in turn in the continual cycle.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

FIG. 6 is a flow chart of a method 600 for spur cancellation.

FIG. 7 is a flow chart of a method 700 for determining a sequence of values that corresponds to energy levels of a spur signal.

The present invention is now described with reference to the figures where like reference numbers indicate identical or functionally similar elements. Also in the figures, the left most digit of each reference number identifies the figure in which the reference number is first used.

DETAILED DESCRIPTION OF THE INVENTION

The present invention relates to a system and a method for spur cancellation. The present invention recognizes that the operations of clocks, input devices, and output devices are among the most significant sources of spurs in a signal processing system, with the spurs occurring at the operating frequencies of these devices and at the harmonic frequencies of the operating frequencies. This phenomenon is particularly troublesome in a broadband signal processing system in which several clocks operating at different frequencies may be used.

Yet, if the different frequencies are selected from a fundamental frequency and at least one harmonic frequency of the fundamental frequency, then a relationship between the occurrence of the spurs and the fundamental frequency can be determined. Ideally, this relationship is static so that a value that corresponds to the energy level of the spur can be subtracted from the signal being processed to cancel the effect of the spur. Realistically, changes in temperature, voltage, or other parameters can cause the relationship to vary. However, the rate of variation is usually slow enough so that a feedback loop can be used to adjust the value that corresponds to the energy level of the spur so that, again, the value can be subtracted from the signal being processed to cancel the effect of the spur.

Figure 1:
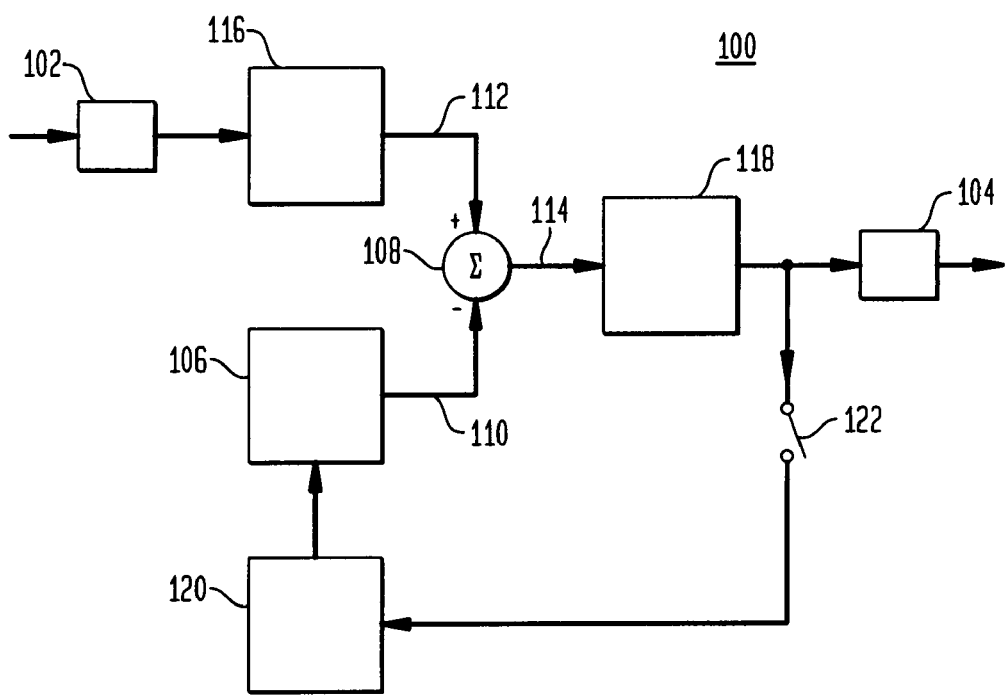
FIG. 1 is a block diagram of a spur cancellation system 100.

FIG. 1 is a block diagram of a spur cancellation system 100. System 100 comprises an input 102, an output 104, a memory 106, and a summer 108. Memory 106 can be random access memory or another memory configuration. A value 110 corresponding to an energy level of a spur is stored in memory 106. Summer 108 is configured to receive an input signal 112 from input 102, to receive value 110 from memory 106, to subtract value 110 from input signal 112, and to convey an output signal 114 to output 104. Output signal 114 is the difference of value 110 subtracted from input signal 112.

Optionally, system 100 further comprises an up-converter 116. In FIG. 1, up-converter 116 is configured to up-convert input signal 112 from a first frequently to a second frequency. For example, if input signal 112 occupies a frequency channel, then the first frequency can be a baseband frequency, while the second frequency can be a wireless transmission frequency. In an embodiment, an up-converter (not shown) can be configured to up-convert output signal 114 from the first frequently to the second frequency. In another embodiment, up-converter 116 can be configured to up-convert input signal 112 from a first frequently to an intermediate frequency and a second up-converter (not shown) can be configured to up-convert output signal 114 from the intermediate frequency to the second frequency.

Optionally, system 100 further comprises a digital-to-analog converter 118. In FIG. 1, digital-to-analog converter 118 is configured to convert output signal 114 from a digital form to an analog form. Alternatively, a first digital-to-analog converter (not shown) can be configured to convert input signal 112 from the digital form to the analog form and a second digital-to-analog converter (not shown) can be configured to convert value 110 from the digital form to the analog form.

Optionally, system 100 further comprises a processor 120. In FIG. 1, processor 120 is configured to receive output signal 114 from output 104, to determine the energy level of the spur from output signal 114, to determine value 110 corresponding to the energy level, and to convey value 110 to memory 106. If output signal 114 is in the analog form, then processor 120 can be further configured to convert output signal 114 to the analog form. In a first mode, processor 120 provides continuous feedback during signal processing operations. In a second mode, processor 120 is used to set up system 100, but is not used during signal processing operations (or is used infrequently during signal processing operations to adjust value 110 to correct for variations due to changes in temperature, voltage, or other parameters).

In the second mode, processor 120 can be used to determine value 110 in an iterative process. To start a first iteration, processor 120 determines a first value 110 and conveys it to memory 106. Summer 108 receives first value 110 and subtracts it from input signal 112. Processor 120 receives output signal 114 and determines if it is still effected by the spur. If output signal 114 is still effected by the spur, then processor 120 determines a second value 110 to start a second iteration. The iterative process can be performed semi-automatically. For example, an oscilloscope (not shown) can be coupled to processor 120 and an observer can determine if output signal 114 is effected by the spur. Alternatively, processor 120 can execute an algorithm to perform the iterative process automatically.

To support the second mode, system 100 can further comprise a switch 122. In FIG. 1, switch 122 is configured to couple output 104 to processor 120. Switch 122 is opened during signal processing operations, but is closed to determine value 110 for system 100 or to adjust value 110 during signal processing operations to correct for variations in the relationship between the occurrence of the spurs and the fundamental frequency due to changes in temperature, voltage, or other parameters. In an embodiment, a switch (not shown) can be configured to couple processor 120 to memory 106. In another embodiment, switch 122 can be configured to couple output 104 to processor 120 and a second switch (not shown) can be configured to couple processor 120 to memory 106.

As stated above, if the several clocks in a broadband signal processing system operate at different frequencies selected from a fundamental frequency and at least one harmonic frequency of the fundamental frequency, then a relationship between the occurrence of the spurs and the fundamental frequency can be determined. Often this relationship can be modeled as a spur signal. In the model, the spur signal can be cyclic with a period that is the inverse of the fundamental frequency. Because the broadband signal processing system has a maximum frequency, the highest harmonic frequency of concern with regards to the occurrence of spurs can be, but is not necessarily, the harmonic frequency that is nearest to the maximum frequency. This harmonic frequency (i.e., a first frequency) is the product of the fundamental frequency multiplied by a first number. To increase the accuracy of the model of the spur signal, the signal being processed is sampled at a second frequency that is the product of the first frequency multiplied by a second number. The second number should be at least two. The accuracy of the model of the spur signal increases with the second number.

Figure 2:
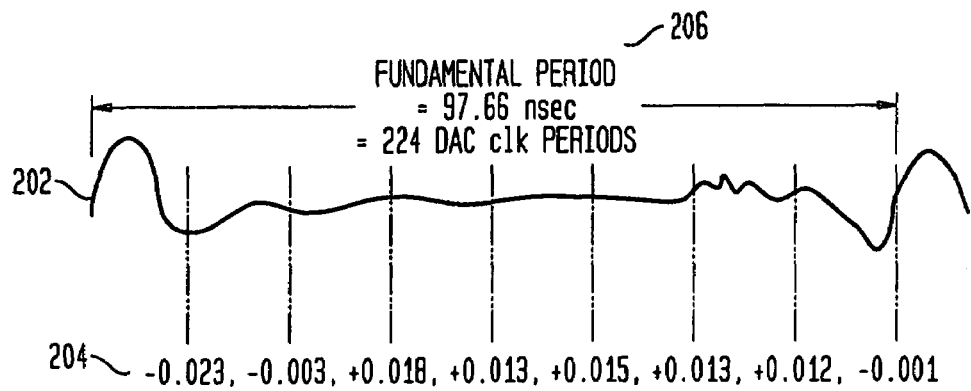
FIG. 2 illustrates a relationship between a spur signal 202 and a sequence 204 of values 110 corresponding to the energy levels of spur signal 202.

FIG. 2 illustrates a relationship between a spur signal 202 and a sequence 204 of values 110 corresponding to the energy levels of spur signal 202. Spur signal 202 has a period 206. Values 110 in sequence 204 correspond to the energy levels of spur signal 202 sampled at the second frequency. The number of values 110 in sequence 204 is the product of the first number multiplied by the second number. For example, if the fundamental frequency is 40.96 MHz, the first frequency is 163.84 MHz, and the second frequency is 327.68 MHz, then period 206 is 24.4140625 nsec and the number of values 110 in sequence 204 is eight, which is the product of four multiplied by two. In FIG. 2, sequence 204 is, for example: −0.023, −0.003, +0.018, +0.013, +0.015, +0.013, +0.012, and −0.001.

Figure 3:
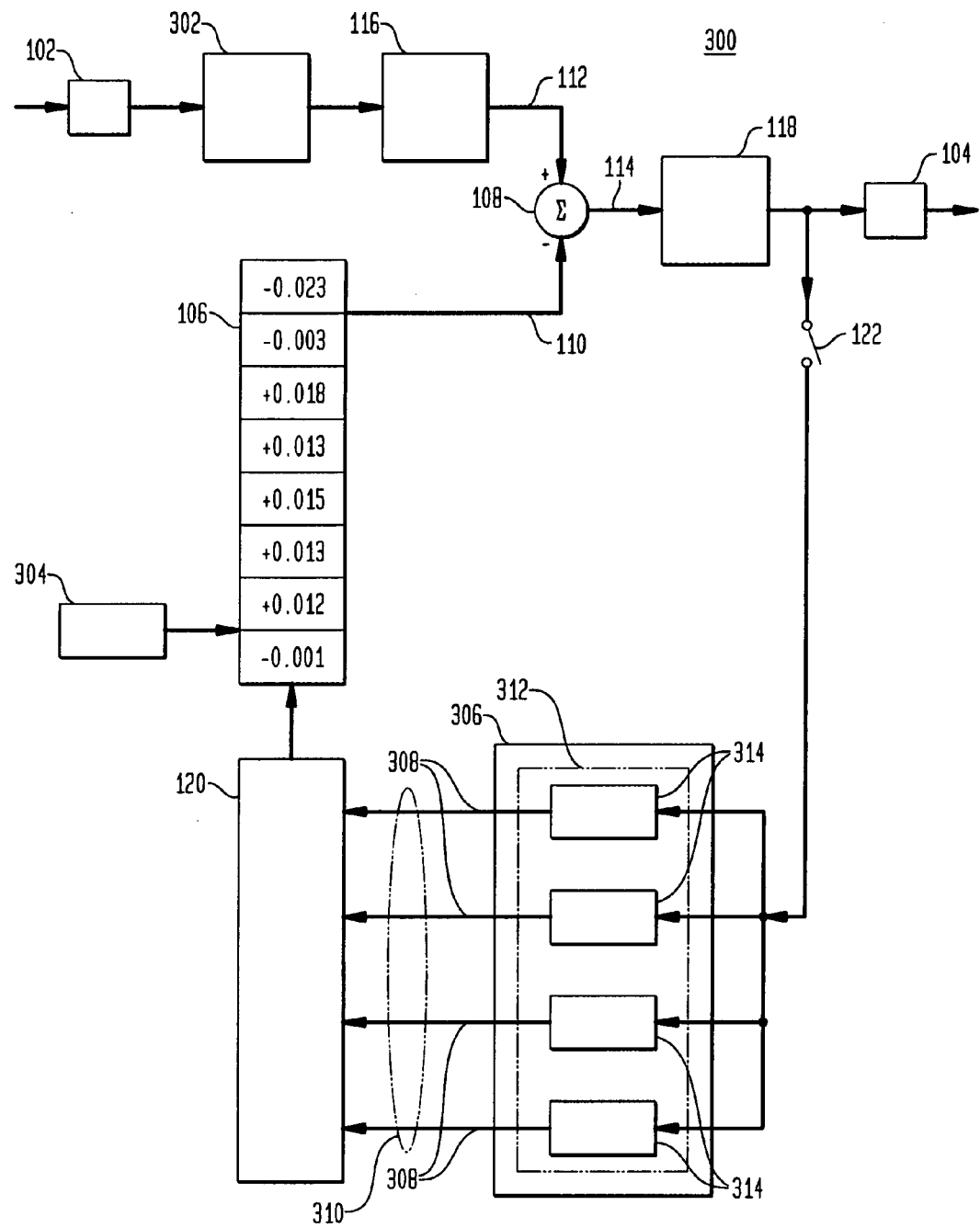
FIG. 3 is a block diagram of a spur signal cancellation system 300.

FIG. 3 is a block diagram of a spur signal cancellation system 300. System 300 modifies system 100 so that memory 106 is configured to store each value 110 of sequence 204 and so that summer 108 is configured to receive each value 110 of sequence 204 in turn in a continual cycle at the second frequency and to subtract each value 110 of sequence 204 from input signal 112 in turn in the continual cycle at the second frequency. For example, memory 106 can store −0.023, −0.003, +0.018, +0.013, +0.015, +0.013, +0.012, and −0.001 and summer 108 can receive each of these values 110 in turn and subtract it in turn from input signal 112. Upon reaching −0.001, the last value 110 in sequence 204, summer 108 proceeds in turn to −0.023, the first value 110 in sequence 204, and continues again through the remaining values 110 in sequence 204 in the continual cycle. Output signal 114 is the difference of each value 110 of sequence 204 subtracted from input signal 112 in turn in the continual cycle at the second frequency.

Optionally, system 300 further comprises an interpolator 302. In FIG. 3, interpolator 302 is configured to receive input signal 112 at the first frequency, to interpolate input signal 112 by the second number, and to convey input signal 112 at the second frequency to summer 108.

Optionally, system 300 further comprises a counter 304. In FIG. 3, counter 304 is configured to control receipt by summer 108 of each value 110 of sequence 204 from memory 106 in turn in the continual cycle at the second frequency.

Optionally, system 300 further comprises processor 120. Processor 120 is configured to receive output signal 114, to determine the energy levels of spur signal 202 from output signal 114, to determine sequence 204 of values 110 corresponding to the energy levels, and to convey sequence 204 of values 110 to memory 106. If output signal 114 is in the analog form, then processor 120 can be further configured to convert output signal 114 to the analog form. In a first mode, processor 120 provides continuous feedback during signal processing operations. In a second mode, processor 120 is used to set up system 300, but is not used during signal processing operations (or is used infrequently during signal processing operations to adjust values 110 to correct for variations due to changes in temperature, voltage, or other parameters).

In the second mode, processor 120 can be used to determine sequence 204 of values 110 in an iterative process. To start a first iteration, processor 120 determines a first sequence 204 of values 110 and conveys it to memory 106. Summer 108 receives each value 110 of first sequence 204 of values 110 in turn in the continual cycle and subtracts each value 110 of first sequence 204 of values 110 from input signal 112 in turn in the continual cycle. Processor 120 receives output signal 114 and determines if it is still effected by the spur.

Processor 120 can be further configured to adjust sequence 204 of values 110 for a phase shift. If output signal 114 is still effected by spur signal 202, then processor 120 can adjust sequence 204 of values 110 for a phase shift to start a second iteration. Because the time consumed by processor 120 in determining first sequence 204 of values 110 can be different from an integer multiple of period 206, it is possible that, when summer 108 subtracts each value 110 of first sequence 204 in turn from input signal 112, the order of values 110 in first sequence 204 is not synchronized with input signal 112 because of a phase shift.

Figure 4:
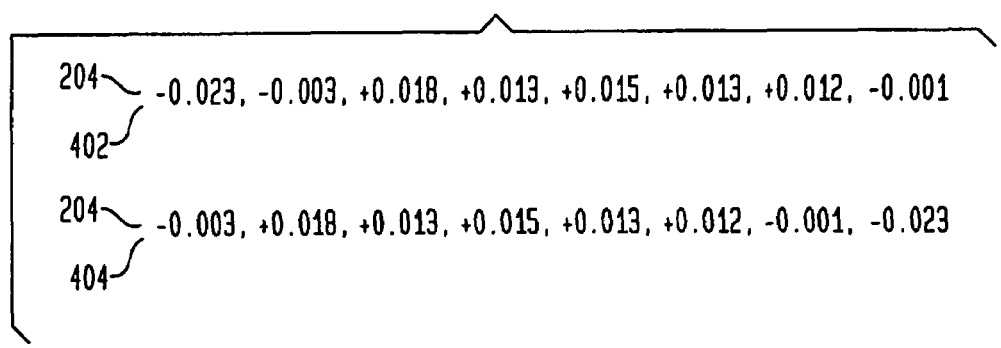
FIG. 4 illustrates first sequence 204 of values 110 in an original order 402 and first sequence 204 of values 110 in an order 404 adjusted for a phase shift.

For example, FIG. 4 illustrates first sequence 204 of values 110 in an original order 402 and first sequence 204 of values 110 in an order 404 adjusted for a phase shift. In FIG. 4, in original order 402, first sequence 204 of values 110 is: −0.023, −0.003, +0.018, +0.013, +0.015, +0.013, +0.012, and −0.001. When original order 402 is adjusted for a phase shift, the first value 110 of original order 402 can become the last value 110 of order 404: −0.003, +0.018, +0.013, +0.015, +0.013, +0.012, −0.001, and −0.023. (Alternatively, original order 402 can be adjusted for a phase shift in the opposite direction by having the last value 110 of original order 402 become the first value 110 of order 404.) If, after adjusting sequence 204 of values 110 for a phase shift, output signal 114 is still effected by spur signal 202, then processor 120 can continue in iterations to adjust sequence 204 of values 110 for a phase shift.

Returning to FIG. 3, if output signal 114 is still effected by spur signal 202, then processor 120 can determine a second sequence 204 of values 110 and continue the iterative process described above. The iterative process can be performed semi-automatically. For example, an oscilloscope (not shown) can be coupled to processor 120 and an observer can determine if output signal 114 is effected by spur signal 202. Alternatively, processor 120 can execute an algorithm to perform the iterative process automatically.

To support the second mode, system 300 can further comprise switch 122. In FIG. 3, switch 122 is configured to couple output 104 to processor 120. Switch 122 is opened during signal processing operations, but is closed to determine values 110 for system 300 or to adjust values 110 during signal processing operations to correct for variations in the relationship between spur signal 202 and the fundamental frequency due to changes in temperature, voltage, or other parameters. In an embodiment, a switch (not shown) can be configured to couple processor 120 to memory 106. In another embodiment, switch 122 can be configured to couple output 104 to processor 120 and a second switch (not shown) can be configured to couple processor 120 to memory 106.

With processor 120, system 300 can optionally further comprise a filter 306. In FIG. 3, filter 306 is configured to receive output signal 114 from output 104, to pass a channel 308 of output signal 114, and to convey channel 308 to processor 120. Channel 308 is at one of the fundamental frequency and at least one harmonic frequency of the fundamental frequency. In this case, processor 120 is configured to receive channel 308 from filter 306 and to determine the energy levels of spur signal 202 from channel 308. Alternatively, filter 306 can be configured to pass a set 310 of channels 308. Each channel 308 in set 310 of channels 308 is at a different frequency selected from the fundamental frequency and at least one harmonic frequency of the fundamental frequency.

Set 310 of channels 308 can include any number of channels 308. However, because the broadband signal processing system has a maximum frequency such that the highest harmonic frequency of concern with regards to the occurrence of spurs can be the harmonic frequency that is nearest to the maximum frequency and this harmonic frequency (i.e., the first frequency) is the product of the fundamental frequency multiplied by the first number, a preferred number of channels 308 is the first number.

In an embodiment, filter 306 is tunable to each channel 308 in set 310 of channels 308. In this case, processor 120 is configured to receive in turn each channel 308 in set 310 of channels 308 from filter 306, to determine in turn the energy levels of spur signal 202 of each channel 308 in set 310 of channels 308, and to determine sequence 204 of values 110 corresponding to the energy levels of spur signal 202 of set 310 of channels 308 from a summation of the energy levels of spur signal 202 of each channel 308 in set 310 of channels 308.

Figure 5:
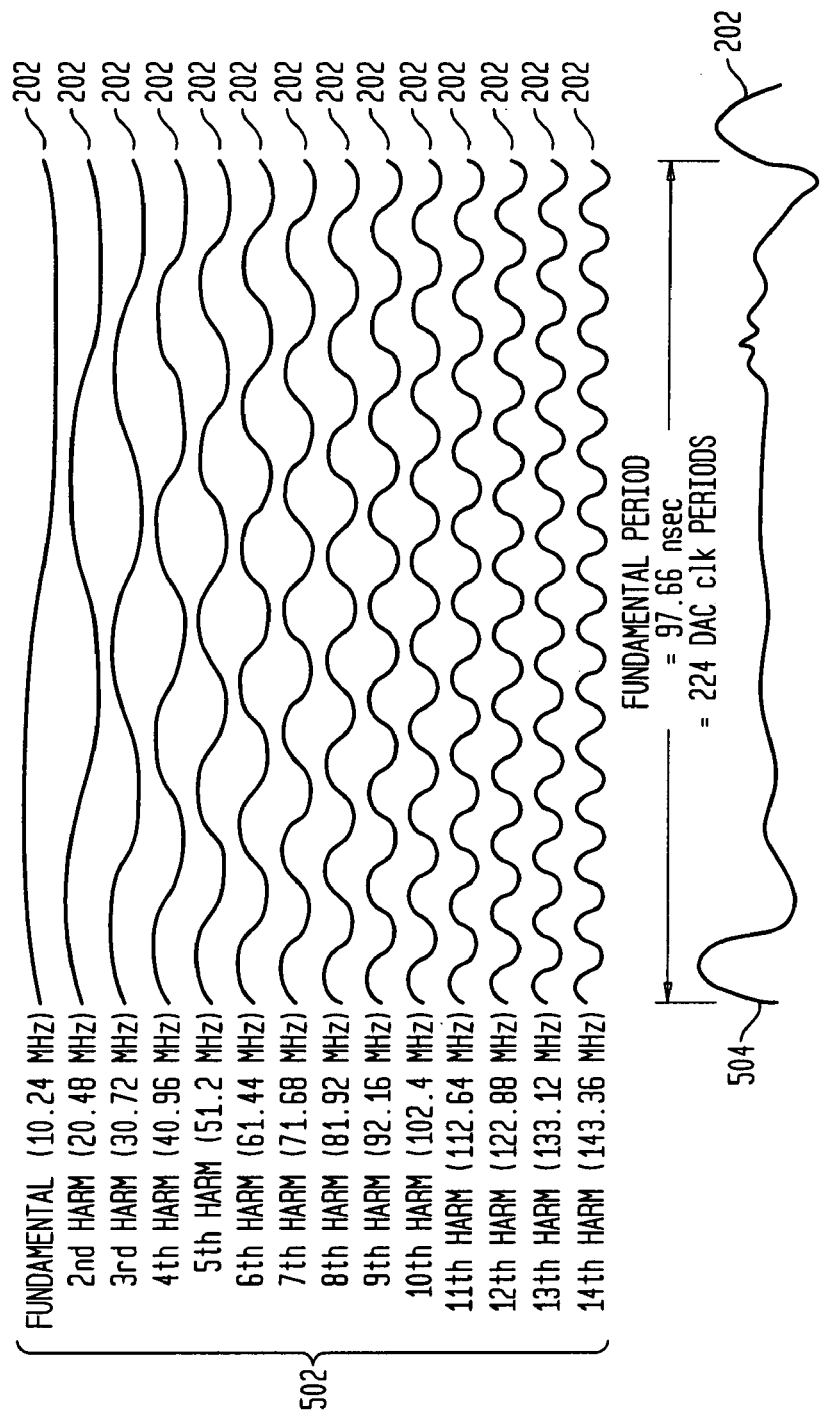
FIG. 5 illustrates a set 502 of spur signals 202.

For example, FIG. 5 illustrates a set 502 of spur signals 202. Set 502 of spur signals 202 includes spur signal 202 of each channel 308 in set 310 of channels 308 for a signal processing system having a fundamental frequency of 10.24 MHz and a maximum frequency of 143.36 MHz (i.e., the harmonic frequency nearest to the maximum frequency is the fourteenth harmonic frequency of the fundamental frequency). Set 502 of spur signals 202 also includes a sum spur signal 504, which is spur signal 202 of set 310 of channels 308. Sum spur signal 504 is a summation of the other spur signals 202 in set 502 of spur signals 202.

Returning to FIG. 3, in another embodiment, filter 306 comprises a set 312 of bandpass filters 314. In this case, processor 120 is configured to receive in parallel each channel 308 in set 310 of channels 308 from a corresponding bandpass filter 314 in set 312 of bandpass filters 314, to determine in parallel the energy levels of spur signal 202 of each channel 308 in set 310 of channels 308, and to determine sequence 204 of values 110 corresponding to the energy levels of spur signal 202 of set 310 of channels 308 from a summation of the energy levels of spur signal 202 of each channel 308 in set 310 of channels 308.

FIG. 6 is a flow chart of a method 600 for spur cancellation. In method 600, at a step 602, an input signal is received. For example, the input signal can be received by an input. At an optional step 604, the input signal is interpolated by a number. For example, the input signal can be interpolated by an interpolator. At an optional step 606, the input signal is up-converted. For example, the input signal can be up-converted by an un-converter. At an optional step 608, the input signal is converted from a digital form to an analog form. For example, the input signal can be converted from the digital form to the analog form by a digital-to-analog converter. At an optional step 610, a value that corresponds to an energy level of a spur is converted from the digital form to the analog form. For example, the value can be converted from the digital form to the analog form by a digital-to-analog converter.

At a step 612, the value is subtracted from the input signal. For example, the value can be subtracted from the input signal by a summer. At a step 614, an output signal is produced. For example, the output signal can be produced from the summer. The output signal is the difference of the value subtracted from the input signal. At an optional step 616, the output signal is converted from the digital form to the analog form. For example, the output signal can be converted from the digital form to the analog form by a digital-to-analog converter. At an optional step 618, the output step is up-converted. For example, the output signal can be up-converted by an up-converter. At an optional step 620, the energy level of the spur is determined from the output signal. For example, the energy level of the spur can be determined from the output signal by a processor. At an optional step 622, the value that corresponds to the energy level is determined. For example, the value that corresponds to the energy level can be determined by the processor.

FIG. 7 is a flow chart of a method 700 for determining a sequence of values that corresponds to energy levels of a spur signal. In method 700, at a step 702, an output signal is received. For example, the output signal can be received by a processor. At an optional step 704, the output signal is filtered to pass a channel of the output signal. For example, the output signal can be filtered by a filter. The channel is at one of a fundamental frequency and a harmonic frequency of the fundamental frequency. Alternatively, the output channel can be filtered to pass a set of channels such that each channel in the set of the channels is at a different frequency selected from the fundamental frequency and at least one harmonic frequency of the fundamental frequency. For example, the output channel can be filtered by a tunable filter or a set of bandpass filters.

At a step 706, the energy levels of the spur signal are determined from the output signal. For example, the energy levels of the spur signal can by determined from the output signal by the processor. If the output signal was filtered to pass the channel of the output signal, then the energy levels of the spur signal can be determined from the channel of the output signal. If the output signal was filtered to pass the set of the channels, then the energy levels of the spur signal of each channel in the set of the channels can be determined from the set of the channels of the output signal.

At a step 708, the sequence of the values that corresponds to the energy levels is determined. For example, the sequence of the values that corresponds to the energy levels can be determined by the processor. If the output signal was filtered to pass the set of the channels, then the sequence of the values that corresponds to the energy levels of the spur signal of the set of the channels can be determined from a summation of the energy levels of the spur signal of each channel in the set of the channels.

At an optional step 710, the sequence of the values is adjusted for a phase shift. For example, the sequence of the values can be adjusted for a phase shift by the processor. At an optional step 712, each value of the sequence of the values is subtracted from an input signal in turn in a continual cycle. For example, each value of the sequence of the values can be subtracted from the input signal in turn in the continual cycle by a summer. At an optional step 714, the output signal is produced. For example, the output signal can be produced by the summer. The output signal is the difference of each value of the sequence of the values subtracted from the input signal in turn in the continual cycle.

Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A system for spur cancellation, comprising:
an input;
an output;
a memory, wherein a value corresponding to an energy level of a spur is stored;
a summer configured to receive an input signal from the input, to receive the value from the memory, to subtract the value from the input signal, and to convey an output signal to the output, wherein the output signal is a difference of the value subtracted from the input signal; and
at least one up-converter configured to up-convert at least one of the input signal and the output signal from a first frequency to a second frequency.

2. The system of claim 1, further comprising a digital-to-analog converter configured to convert the output signal from a digital form to an analog form.

3. The system of claim 1, further comprising:
a first digital-to-analog converter configured to convert the input signal from a digital form to an analog form; and
a second digital-to-analog converter configured to convert the value from the digital form to the analog form.

4. The system of claim 1, further comprising:
a processor configured to receive the output signal from the output, to determine the energy level of the spur from the output signal, to determine the value corresponding to the energy level, and to convey the value to the memory.

5. A system for spur cancellation, comprising:
an input;
an output;
a memory, wherein a value corresponding to an energy level of a spur is stored;
a summer configured to receive an input signal from the input, to receive the value from the memory, to subtract the value from the input signal, and to convey an output signal to the output, wherein the output signal is a difference of the value subtracted from the input signal;

a processor configured to receive the output signal from the output, to determine the energy level of the spur from the output signal, to determine the value corresponding to the energy level, and to convey the value to the memory; and at least one switch configured to couple at least one of the output to the processor and the processor to the memory.

6. A system for spur cancellation, comprising:

an input;

an output;

a memory, wherein a value corresponding to an energy level of a spur is stored; and a summer configured to receive an input signal from the input, to receive the value from the memory, to subtract the value from the input signal, and to convey an output signal to the output, wherein the output signal is a difference of the value subtracted from the input signal;

wherein the value corresponding to the energy level of the spur is a sequence of values corresponding to energy levels of a spur signal sampled at a first frequency, the sequence of the values has a number of the values, the number of the values is a product of a first number multiplied by a second number, the memory is configured to store each value of the sequence of the values, the summer is configured to receive each value of the sequence of the values in turn in a continual cycle at the first frequency and to subtract each value of the sequence of the values from the input signal in turn in the continual cycle at the first frequency, and the output signal is a difference of each value of the sequence of the values subtracted from the input signal in turn in the continual cycle at the first frequency.

7. The system of claim 6, further comprising an interpolator configured to receive the input signal at a second frequency from the input, to interpolate the input signal by the first number, and to convey the input signal at the first frequency to the summer, wherein the second frequency is a product of a fundamental frequency multiplied by the second number, the first frequency is a product of the second frequency multiplied by the first number, and the first number is at least two.

8. The system of claim 6, further comprising a counter configured to control receipt by the summer of each value of the sequence of the values from the memory in turn in the continual cycle at the first frequency.

9. The system of claim 6, further comprising:

a processor configured to receive the output signal from the output, to determine the energy levels of the spur signal from the output signal, to determine the sequence of the values corresponding to the energy levels, and to convey the sequence of the values to the memory.

10. The system of claim 9, wherein the processor is further configured to adjust the sequence of the values for a phase shift.

11. The system of claim 9, further comprising:

at least one switch configured to couple at least one of the output to the processor and the processor to the memory.

12. The system of claim 9, further comprising:

a filter configured to receive the output signal from the output, to pass a channel of the output signal, and to convey the channel to the processor, wherein the channel is at one of the fundamental frequency and a harmonic frequency of the fundamental frequency, wherein the processor is configured to receive the channel from the filter and to determine the energy levels of the spur signal from the channel.

13. The system of claim 12, wherein the channel is a set of channels and each channel in the set of the channels is at a different frequency selected from the fundamental frequency and at least one harmonic frequency of the fundamental frequency.

14. The system of claim 13, wherein the set of the channels has a number of the channels and the number of the channels is the second number.

15. The system of claim 13, wherein the filter is tunable to each channel in the set of channels and the processor is configured to receive in turn each channel in the set of the channels from the filter, to determine in turn the energy levels of the spur signal of each channel in the set of the channels, and to determine the sequence of the values corresponding to the energy levels of the spur signal of the set of the channels from a summation of the energy levels of the spur signal of each channel in the set of the channels.

16. The system of claim 13, wherein the filter comprises a set of bandpass filters and the processor is configured to receive in parallel each channel in the set of the channels from a corresponding bandpass filter in the set of bandpass filters, to determine in parallel the energy levels of the spur signal of each channel in the set of the channels, and to determine the sequence of the values corresponding to the energy levels of the spur signal of the set of the channels from a summation of the energy levels of the spur signal of each channel in the set of the channels.

17. A method for spur cancellation, comprising the steps of:

(1) receiving an input signal;

(2) subtracting a value from the input signal, wherein the value corresponds to an energy level of a spur;

(3) producing an output signal, wherein the output signal is a difference of the value subtracted from the input signal; and (4) interpolating the input signal by a number.

18. The method of claim 17, further comprising the step of:

(5) up-converting at least one of the input signal and the output signal.

19. The method of claim 18, further comprising the steps of:

(6) converting the input signal from a digital form to an analog form; and (7) converting the value from the digital form to the analog form.

20. The method of claim 18, further comprising the step of:

(6) converting the output signal from a digital form to an analog form.

21. The method of claim 18, further comprising the steps of:

(6) determining the energy level of the spur from the output signal; and (7) determining the value that corresponds to the energy level.

22. A method for determining a sequence of values that corresponds to energy levels of a spur signal, comprising the steps of:

(1) receiving an output signal;

(2) determining the energy levels of the spur signal from a channel of the output signal;

(3) determining the sequence of the values that corresponds to the energy levels; and
(4) filtering the output signal to pass the channel of the output signal, wherein the channel is at one of a fundamental frequency and a harmonic frequency of the fundamental frequency.

23. The method of claim 22, wherein the channel is a set of channels, each channel in the set of the channels is at a different frequency selected from the fundamental frequency and at least one harmonic frequency of the fundamental frequency, step (2) comprises determining the energy levels of the spur signal of each channel in the set of the channels, and step (3) comprises determining the sequence of the values that corresponds to the energy levels of the spur signal of the set of the channels from a summation of the energy levels of the spur signal of each channel in the set of the channels.

24. The method of claim 22, further comprising the step of:
(4) adjusting the sequence of the values for a phase shift.

25. The method of claim 22, further comprising the steps of:
(4) subtracting each value of the sequence of the values from an input signal in turn in a continual cycle; and
(5) producing the output signal, wherein the output signal is a difference of each value of the sequence of the values subtracted from the input signal in turn in the continual cycle.

* * * * *